US012677447B2

(12) United States Patent
Cho et al.

(10) Patent No.: US 12,677,447 B2
(45) Date of Patent: Jul. 7, 2026

(54) THIN FILM TRANSISTOR SUBSTRATE AND DISPLAY DEVICE COMPRISING THE SAME

(71) Applicant: LG Display Co., Ltd., Seoul (KR)

(72) Inventors: HyunCheol Cho, Paju-si (KR); Hyelim Ji, Paju-si (KR); Yeonkyung Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 539 days.

(21) Appl. No.: 17/901,793

(22) Filed: Sep. 1, 2022

(65) Prior Publication Data

US 2023/0074433 A1 Mar. 9, 2023

(30) Foreign Application Priority Data

Sep. 3, 2021 (KR) ........................ 10-2021-0117993
Dec. 31, 2021 (KR) ........................ 10-2021-0194723

(51) Int. Cl.
*H10D 30/67* (2025.01)
*H10K 59/121* (2023.01)

(52) U.S. Cl.
CPC ..... *H10D 30/6757* (2025.01); *H10D 30/6729* (2025.01); *H10D 30/6755* (2025.01); *H10K 59/1213* (2023.02)

(58) Field of Classification Search
CPC ........... H10D 30/6757; H10D 30/6729; H10D 30/6755; H10D 86/423; H10D 86/471; H10D 86/60; H10K 59/1213
See application file for complete search history.

(56) References Cited

U.S. PATENT DOCUMENTS

| | | | | |
|---|---|---|---|---|
| 10,977,978 | B1 * | 4/2021 | Zheng | ...................... G09G 3/20 |
| 11,056,511 | B2 * | 7/2021 | Chung | ............... H10K 59/1213 |
| 12,080,717 | B2 * | 9/2024 | Yamazaki | .............. H10D 86/60 |
| 12,096,656 | B2 * | 9/2024 | Yuan | .................. H10D 30/6729 |

(Continued)

FOREIGN PATENT DOCUMENTS

| | | |
|---|---|---|
| CN | 110034191 A | 7/2019 |
| CN | 111243541 A | 6/2020 |

(Continued)

*Primary Examiner* — Tan N Tran
(74) *Attorney, Agent, or Firm* — Seed Intellectual Property Law Group LLP

(57) ABSTRACT

A thin film transistor substrate and a display device comprising the same are provided, in which the thin film transistor substrate comprises a first thin film transistor on a base substrate, and a second thin film transistor on the first thin film transistor, wherein the first thin film transistor includes a first active layer on the base substrate, a first gate electrode spaced apart from the first active layer, and a first source electrode and a first drain electrode, which are spaced apart from each other and connected to the first active layer, the second thin film transistor includes a second active layer on the base substrate, a second gate electrode spaced apart from the second active layer, and a second source electrode and a second drain electrode, which are spaced apart from each other and connected to the second active layer, and one of the first source electrode and the first drain electrode is connected to one of the second source electrode and the second drain electrode.

19 Claims, 10 Drawing Sheets

(56)     References Cited

U.S. PATENT DOCUMENTS

| | | | | |
|---|---|---|---|---|
| 2007/0075959 A1* | 4/2007 | Tobita | .................... | G11C 19/28 |
| | | | | 345/98 |
| 2018/0033849 A1* | 2/2018 | Noh | .................... | H10D 86/441 |
| 2019/0181274 A1 | 6/2019 | Noh et al. | | |
| 2020/0135825 A1* | 4/2020 | Cha | .................... | H10K 59/1213 |
| 2024/0373689 A1* | 11/2024 | Wang | .................... | H10D 86/00 |

FOREIGN PATENT DOCUMENTS

| | | | |
|---|---|---|---|
| CN | 113113425 | A | 7/2021 |
| JP | 2018026551 | A | 2/2018 |
| KR | 10-2017-0061531 | A | 6/2017 |
| KR | 10-2018-0030286 | A | 3/2018 |
| KR | 20190079828 | A | 7/2019 |
| KR | 20190080546 | A | 7/2019 |
| KR | 10-2020-0045102 | A | 5/2020 |
| KR | 10-2023-0034844 | A | 3/2023 |

* cited by examiner

FIG. 11

THIN FILM TRANSISTOR SUBSTRATE AND DISPLAY DEVICE COMPRISING THE SAME

CROSS-REFERENCE TO RELATED APPLICATIONS

This application claims the benefit of priorities of the Korean Patent Application No. 10-2021-0117993 filed on Sep. 3, 2021 and Korean Patent Application No. 10-2021-0194723 filed on Dec. 31, 2021, which are hereby incorporated by reference as if fully set forth herein.

BACKGROUND

Technical Field

The present disclosure relates to a thin film transistor substrate and a display device comprising the same. In more detail, the present disclosure relates to a thin film transistor substrate having a first thin film transistor and a second thin film transistor stacked vertically and a display device comprising the same.

Description of the Related Art

A display device has become more important with the development of multimedia, and a flat panel display device, such as a liquid crystal display device, a plasma display device and an organic light emitting display device, has been commercially used.

The flat panel display device may include a gate driver for sequentially supplying scan signals to a plurality of pixels. The gate driver includes a plurality of stages that include multiple transistors, and the stages are connected in a cascade to sequentially output scan signals. The output scan signals are transferred to the plurality of pixels through gate lines.

Recently, a gate in panel (GIP) structure in which a gate driver is embedded in a display panel in the form of thin film transistors has been applied. When the GIP structure is applied, a slim size of the display device may be obtained, external esthetic appearance of the display device may be improved, and a manufacturing cost of the display device may be reduced.

In this GIP structure, the gate driver is disposed on a base substrate, a large number of thin film transistors are disposed in the gate driver to improve performance of the display device, whereas an area of the gate driver needs to be reduced to reduce a bezel area. Therefore, there is a need for a gate driver having high performance and a narrow area.

Therefore, methods of efficiently disposing a large number of thin film transistors in a narrow area have been studied.

BRIEF SUMMARY

The present disclosure has been made in view of the above problems and it is a benefit of the present disclosure to provide a thin film transistor substrate in which a large number of thin film transistors may be disposed in the same area.

It is another benefit of the present disclosure to provide a thin film transistor substrate in which thin film transistors are disposed to be stacked to reduce an arrangement area of the thin film transistors.

It is still another benefit of the present disclosure to provide a thin film transistor substrate in which a plurality of thin film transistors are stacked up and down to improve efficiency of line connection and reduce an arrangement area of the thin film transistors.

It is further still another benefit of the present disclosure to provide a method of reducing an area of a gate driver by stacking thin film transistors.

It is further still another benefit of the present disclosure to provide a display device comprising the above thin film transistor.

It is further still another benefit of the present disclosure to provide a display device comprising a gate driver having a narrow area by including a plurality of thin film transistors disposed to be stacked.

It is further still another benefit of the present disclosure to provide a display device comprising a bezel area having a narrow area as a gate driver has a narrow area.

In addition to the benefits of the present disclosure as mentioned above, additional benefits and features of the present disclosure will be clearly understood by those skilled in the art from the following description of the present disclosure.

In accordance with an aspect of the present disclosure, the above and other benefits can be accomplished by the provision of a thin film transistor substrate comprising a first thin film transistor on a base substrate, and a second thin film transistor on the first thin film transistor, wherein the first thin film transistor includes a first active layer on the base substrate, a first gate electrode spaced apart from the first active layer, and a first source electrode and a first drain electrode, which are spaced apart from each other and connected to the first active layer, the second thin film transistor includes a second active layer on the base substrate, a second gate electrode spaced apart from the second active layer, and a second source electrode and a second drain electrode, which are spaced apart from each other and connected to the second active layer, and one of the first source electrode and the first drain electrode is connected to one of the second source electrode and the second drain electrode.

One of the first source electrode and the first drain electrode may be integrally formed with one of the second source electrode and the second drain electrode.

The first gate electrode may be disposed between the base substrate and the first active layer, and the second active layer may be disposed between the first active layer and the second gate electrode.

A distance between the first active layer and the second active layer may be greater than a distance between the first active layer and the first gate electrode and greater than a distance between the second active layer and the second gate electrode.

The first active layer may include a first channel portion overlapped with the first gate electrode, a first common connection portion connected to one side of the first channel portion, and a first active connection portion connected to the other side of the first channel portion, the second active layer may include a second channel portion overlapped with the second gate electrode, a second common connection portion connected to one side of the second channel portion, and a second active connection portion connected to the other side of the second channel portion, and one of the first source electrode and the first drain electrode and one of the second source electrode and the second drain electrode may be connected to the first common connection portion and the second common connection portion.

The thin film transistor substrate may further comprise a first metal layer on the first common connection portion and the first active connection portion.

The thin film transistor substrate may further comprise a second metal layer on the second common connection portion and the second active connection portion.

The other one of the first source electrode and the first drain electrode may be connected to the other one of the second source electrode and the second drain electrode.

At least one of the first active layer or the second active layer may include an oxide semiconductor material.

At least one of the first active layer or the second active layer may include a first oxide semiconductor layer, and a second oxide semiconductor layer on the first oxide semiconductor layer.

Each of the first active layer and the second active layer may include an oxide semiconductor material, and the first active layer may have mobility different from that of the second active layer.

The first gate electrode and the second gate electrode may be integrally formed to be a common gate electrode.

The common gate electrode may be disposed on the second active layer, and the first thin film transistor and the second thin film transistor may be configured to be simultaneously turned on by a gate voltage applied to the common gate electrode.

The common gate electrode may be disposed between the first active layer and the second active layer, and the first thin film transistor and the second thin film transistor may be configured to be simultaneously turned on by a gate voltage applied to the common gate electrode.

The common gate electrode may be disposed between the first active layer and the base substrate, and the first thin film transistor and the second thin film transistor may be configured to be simultaneously turned on by a gate voltage applied to the common gate electrode.

In accordance with another aspect of the present disclosure, the above and other benefits can be accomplished by the provision of a display device comprising the above thin film transistor substrate.

The display device may further comprise a gate driver on the base substrate, wherein the gate driver may include the first thin film transistor and the second thin film transistor.

The gate driver may include two or more pull-up transistors, and each of the first thin film transistor and the second thin film transistor may be a respective pull-up transistor of the two or more pull-up transistors of the gate driver.

The gate driver may include two or more pull-down transistors, and each of the first thin film transistor and the second thin film transistor may be a respective pull-down transistor of the two or more pull-down transistors of the gate driver.

The gate driver may include two or more reset transistors, and each of the first thin film transistor and the second thin film transistor may be a respective reset transistor of the two or more reset transistors of the gate driver.

The gate driver may include two or more switching transistors, and each of the first thin film transistor and the second thin film transistor may be a respective switching transistor of the two or more switching transistors of the gate driver.

The display device may further comprise a pixel driving circuit on the base substrate, and the pixel driving circuit may include the first thin film transistor and the second thin film transistor.

The pixel driving circuit may include an internal compensation circuit.

In accordance with various embodiments, a display device includes a data driver and a display panel. The display panel includes a base substrate, a gate driver on the base substrate, and a pixel on the base substrate. The gate driver includes: a first thin film transistor on the base substrate, and a second thin film transistor on and overlapping the first thin film transistor. The first thin film transistor includes: a first active layer; a first gate electrode vertically separated from the first active layer; and a first source/drain electrode in contact with the first active layer. The second thin film transistor includes: a second active layer overlapping the first active layer; a second gate electrode vertically separated from the second active layer; and a second source/drain electrode in contact with the second active layer and in contact with the first source/drain electrode. The pixel is electrically connected to the data driver and the gate driver.

BRIEF DESCRIPTION OF THE SEVERAL VIEWS OF THE DRAWINGS

The above and other benefits, features and other advantages of the present disclosure will be more clearly understood from the following detailed description taken in conjunction with the accompanying drawings, in which:

FIG. 11 is a circuit diagram illustrating a stage provided in the shift register of FIG. 10;

DETAILED DESCRIPTION

Figure 1:
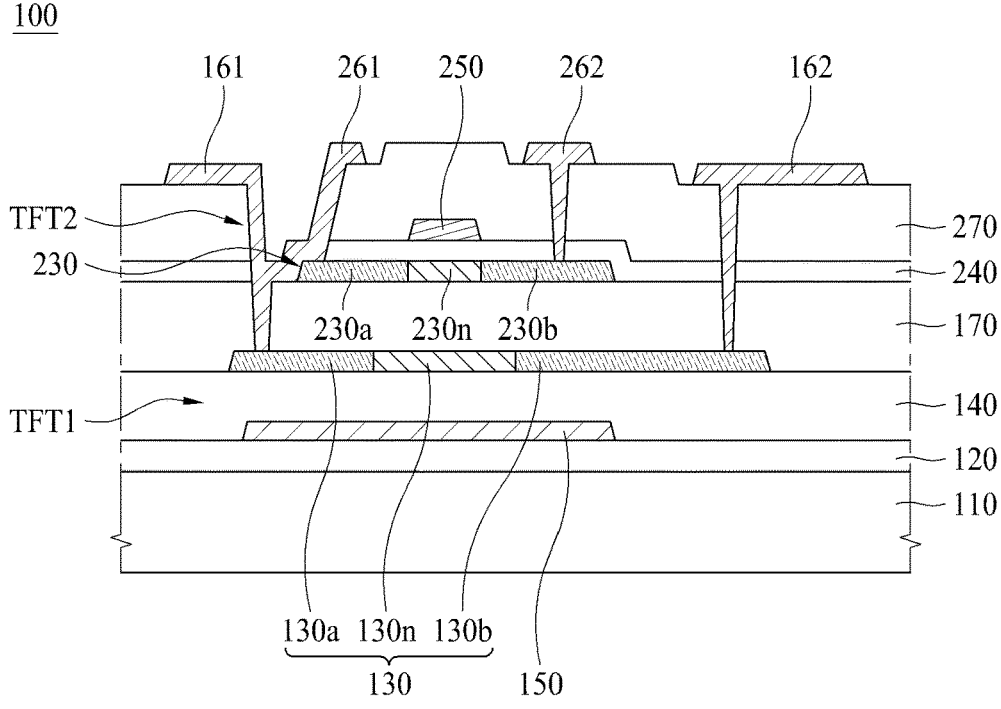
FIG. 1 is a cross-sectional view illustrating a thin film transistor substrate according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~', 'below~,' and 'next to~,' one or more portions may be arranged between two other portions unless 'just' or 'direct' is used.

Spatially relative terms such as "below," "beneath," "lower," "above," and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below," or "beneath" another device may be arranged "above" another device. Therefore, a term "below or beneath" may include "below or beneath" and "above" orientations. Likewise, a term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to partition one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, a source region may be a source electrode, and a drain region may be a drain electrode. Also, a source region may be a drain electrode, and a drain region may be a source electrode.

FIG. 1 is a cross-sectional view illustrating a thin film transistor substrate 100 according to one embodiment of the present disclosure.

The thin film transistor substrate 100 according to one embodiment of the present disclosure includes a first thin film transistor TFT1 and a second thin film transistor TFT2 on a base substrate 110.

Glass or plastic may be used as the base substrate 110. A transparent plastic having a flexible property, e.g., polyimide may be used as the plastic. When the polyimide is used as the base substrate 110, a heat-resistant polyimide capable of enduring a high temperature may be used considering that a high temperature deposition process is performed on the base substrate 110.

A buffer layer 120 is disposed on the base substrate 110. The buffer layer 120 may be made of an insulating material. For example, the buffer layer 120 may include at least one of insulating materials such as a silicon oxide, a silicon nitride and a metal-based oxide. The buffer layer 120 may have a single layered structure, or may have a multi-layered structure.

The buffer layer 120 may protect active layers 130 and 230 by blocking the air and water. Also, a surface on the base substrate 110 on which a light shielding layer 215 is disposed may become uniform by the buffer layer 120. The buffer layer 120 may be omitted.

Although not shown, a light shielding layer may be disposed on the base substrate 110. The light shielding layer may shield light incident from the outside to protect the thin film transistors TFT1 and TFT2. The light shielding layer may be disposed between the base substrate 110 and the buffer layer 120.

Referring to FIG. 1, the first thin film transistor TFT1 and the second thin film transistor TFT2 may be disposed on the buffer layer 120.

The first thin film transistor TFT1 may include a first active layer 130 on the base substrate 110 and a first gate electrode 150 spaced apart from the first active layer 130. Also, the first thin film transistor TFT1 may include a first source electrode 161 and a first drain electrode 162, which are spaced apart from each other and connected with the first active layer 130.

Referring to FIG. 1, the first gate electrode 150 may be disposed on the buffer layer 120.

The first gate electrode 150 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd) or titanium (Ti). The first gate electrode 150 may have a multi-layered structure including at least two conductive layers having different physical properties.

The first gate electrode 150 is disposed between the base substrate 110 and the first active layer 130. The first gate electrode 150 may have light shielding characteristics. Therefore, the first gate electrode 150 may serve as a light shielding layer. As shown in FIG. 1, when the first gate electrode 150 is disposed below the first active layer 130, the light shielding layer may be omitted.

A first gate insulating layer 140 is disposed on the first gate electrode 150. The first gate insulating layer 140 may include at least one of a silicon oxide, a silicon nitride or a metal-based oxide. The first gate insulating layer 140 may have a single layered structure, or may have a multi-layered structure.

The first gate insulating layer 140 protects the first active layer 130.

The first active layer 130 is disposed on the first gate insulating layer 140. The first gate electrode 150 at least partially overlaps the first active layer 130.

According to one embodiment of the present disclosure, the first active layer 130 may be formed by a semiconductor material. The first active layer 130 may include an oxide semiconductor material.

The oxide semiconductor material may include, for example, at least one of an IZO(InZnO)-based oxide semiconductor material, an IGO(InGaO)-based oxide semiconductor material, an ITO(InSnO)-based oxide semiconductor material, an IGZO(InGaZnO)-based oxide semiconductor material, an IGZTO(InGaZnSnO)-based oxide semiconductor material, a GZTO(GaZnSnO)-based semiconductor material, a GZO(GaZnO)-based semiconductor material, an ITZO(InSnZnO)-based oxide semiconductor material, or a FIZO(FeInZnO)-based oxide semiconductor material, but one embodiment of the present disclosure is not limited thereto, and the first active layer 130 may be made of another oxide semiconductor material known in the art.

The first active layer 130 may include a first channel portion 130n, a first common connection portion 130a and a first active connection portion 130b. The first common connection portion 130a may be connected to one side of the first channel portion 130n, and the first active connection portion 130b may be connected to the other side of the first channel portion 130n.

The first channel portion 130n overlaps the gate electrode 150. The first channel portion 130n may be protected by the gate electrode 150. The first channel portion 130n serves as a channel.

The first common connection portion 130a and the first active connection portion 130b may be formed by selective conductorization of the first active layer 130 made of a semiconductor material. For example, the first common connection portion 130a and the first active connection portion 130b may be selectively conductorized by doping based on a dopant while using a second gate electrode 250 as a mask. Namely, the conductivity of the active layer can be modified to be a selected value by adding the proper type and amount of dopants, thus, it can be "conductorized."

For example, after the first active layer 130 is formed, the first active layer 130 may be selectively conductorized by a method of doping using a remaining photoresist pattern as a mask. As a result, the first common connection portion 130a and the first active connection portion 130b may be formed, but one embodiment of the present disclosure is not limited thereto, and the first active layer 130 may be selectively conductorized by other methods known in the art.

The first common connection portion 130a and the first active connection portion 130b have more excellent electrical conductivity than the first channel portion 130n. Therefore, each of the first common connection portion 130a and the first active connection portion 130b may serve as a line or a wire.

A passivation layer 170 may be disposed on the first active layer 130. The passivation layer 170 is an insulating layer made of an insulating material. The passivation layer 170 may be made of an organic material, or may be made of an inorganic material, or may be made of a stacked body of an organic layer and an inorganic layer. The passivation layer 170 may include a silicon oxide, a silicon nitride, a metal oxide, and the like.

According to one embodiment of the present disclosure, the first thin film transistor TFT1 and the second thin film transistor TFT2 may be distinguished from each other by the passivation layer 170. In order to distinguish the first thin film transistor TFT1 from the second thin film transistor TFT2, the passivation layer 170 may have a relatively large thickness.

According to one embodiment of the present disclosure, the passivation layer 170 may prevent the first active layer 130 and the second active layer 230 from interfering with each other. It should be understood that "interfering" includes the meanings "electrically interfering" and "physically contacting." For example, electrical interference may occur due to parasitic capacitive coupling between the first and second active layers 130, 230, and the parasitic capacitance may be reduced by increased distance between the first and second active layers 130, 230 due to thickness of the passivation layer 170. A short circuit may be prevented due to the first and second active layers 130, 230 being physically separated by the passivation layer 170.

When the passivation layer 170 is made of a silicon oxide (SiO$_2$) having a dielectric constant of about 3.9, the passivation layer 170 may have a thickness of 0.2 μm or more.

When the passivation layer 170 is made of silicon oxide (SiO$_2$) having a dielectric constant of about 3.4, the passivation layer 170 may have a thickness of 0.6 μm or more.

When the thickness of the passivation layer 170 is increased, the thickness of the entire device may be increased. Therefore, the passivation layer 170 may have a thickness of 2.5 μm or less.

According to one embodiment of the present disclosure, the passivation layer 170 may have a thickness of 0.6 μm to 2.5 μm, may have a thickness of 1.0 μm to 2.0 μm, or may have a thickness of 1.0 μm to 1.5 μm.

According to one embodiment of the present disclosure, a distance between the first active layer 130 and the second active layer 230, which may be equal to thickness of the passivation layer 170 in a region of overlap of the first and second active layers 130, 230, may be set to be greater than a distance between the first active layer 130 and the first gate electrode 150 and a distance between the second active layer 230 and a second gate electrode 250. It should be understood that the distances are measured in the vertical direction, e.g., the direction orthogonal to the major surface of the base substrate 110.

The second active layer 230 is disposed on the passivation layer 170. The second active layer 230 is disposed between the first active layer 130 and the second gate electrode 250.

According to one embodiment of the present disclosure, the second active layer 230 may be formed of a semiconductor material. The second active layer 230 may include an oxide semiconductor material.

The second active layer 230 may be made of the same oxide semiconductor material as that of the first active layer 130, or may be made of an oxide semiconductor material different from that of the first active layer 130. In addition, the first active layer 130 and the second active layer 230 may have substantially the same mobility, or may have different mobility from each other.

In detail, each of the first active layer 130 and the second active layer 230 may include an oxide semiconductor material, and may have different mobility from each other. As a result, the first thin film transistor TFT1 and the second thin film transistor TFT2 may have their respective electrical characteristics that are different from each other. According to one embodiment of the present disclosure, the first thin film transistor TFT1 and the second thin film transistor TFT2 may be respectively designed to satisfy electrical characteristics beneficial for the product. For example, when excellent current characteristics are beneficial for the first thin film transistor TFT1 and excellent stability is beneficial for the second thin film transistor TFT2, the first active layer 130 may be made of a high-mobility oxide semiconductor material and the second active layer 230 may be made of an oxide semiconductor material having excellent stability, and vice versa.

The second active layer 230 may include a second channel portion 230n, a second common connection portion 230a and a second active connection portion 230b. The second common connection portion 230a may be connected to one side of the second channel portion 230n, and the second active connection portion 230b may be connected to the other side of the second channel portion 230n. It should be understood that the second channel portion 230n, the second common portion 230a and the second active connection portion 230b may be integrally formed. Similarly, the first channel portion 130n, the first common portion 130a and the first active connection portion 130b may be integrally formed.

The second common connection portion 230a and the second active connection portion 230b may be formed by selective conductorization of the second active layer 230. For example, the second common connection portion 230a and the second active connection portion 230b may be selectively conductorized by doping based on a dopant while using the second gate electrode 250 as a mask.

The second channel portion 230n overlaps the second gate electrode 250. The second channel portion 230n serves as a channel.

Referring to FIG. 1, a length of the second channel portion 230n is shorter than that of the first channel portion 130n, but one embodiment of the present disclosure is not limited thereto, and the length of the first channel portion 130n may be shorter than that of the second channel portion 230n, and the length of the first channel portion 130n and the length of the second channel portion 230n may be equal to each other. Hereinafter, in other embodiments described below, the length of the first channel portion 130n may be longer or shorter than that of the second channel portion 230n, and the length of the first channel portion 130n and the length of the second channel portion 230n may be equal to each other.

After the second active layer 230 and the second gate electrode 250 are formed, the first active layer 130 may be selectively conductorized, meaning, it is set at the desired conductivity, by doping using the second gate electrode 250 as a mask. As a result, the second common connection portion 230a and the second active connection portion 230b may be formed during selective conductorization of the first active layer 130, but one embodiment of the present disclosure is not limited thereto, and the second active layer 230 may be selectively conductorized by other methods known in the art.

The second common connection portion 230a and the second active connection portion 230b have more excellent electrical conductivity than the second channel portion 230n. Therefore, each of the second common connection portion 230a and the second active connection portion 230b may serve as a line.

A second gate insulating layer 240 is disposed on the second active layer 230. The second gate insulating layer 240 may cover an upper portion of the second active layer 230. The second gate insulating layer 240 protects the second active layer 130. As shown in FIG. 1, the second gate insulating layer 240 may be in contact with a sidewall of the second active connection portion 230b, and may be separated from a sidewall of the second common connection portion 230a by source electrodes 161, 261.

The second gate insulating layer 240 may include at least one of a silicon oxide, a silicon nitride or a metal-based oxide. The second gate insulating layer 240 may have a single layered structure, or may have a multi-layered structure.

The second gate electrode 250 is disposed on the second gate insulating layer 240.

The second gate electrode 250 may include a metal or a metal alloy. The second gate electrode 250 may be made of the same material as that of the first gate electrode 150, or may be made of a material different from that of the first gate electrode 150.

The second gate electrode 250 is spaced apart from the second active layer 230 to at least partially overlap the second active layer 230. The second gate electrode 250 overlaps the second channel portion 230n of the second active layer 230.

An interlayer insulating layer 270 may be disposed on the second gate electrode 250. The interlayer insulating layer 270 is an insulating layer made of an insulating material. The interlayer insulating layer 270 may be made of an organic material, or may be made of an inorganic material, or may be made of a stacked body of an organic layer and an inorganic layer.

The source electrodes 161 and 261 and the drain electrodes 162 and 262 may be disposed on the interlayer insulating layer 170.

The first source electrode 161 and the first drain electrode 162 of the first thin film transistor TFT1 may be spaced apart from each other and connected to the first active layer 130, respectively.

The second source electrode 261 and the second drain electrode 262 of the second thin film transistor TFT2 may be spaced apart from each other and connected to the second active layer 230, respectively.

The source electrodes 161 and 261 and the drain electrodes 162 and 262 may be respectively connected to the first and second active layers 130 and 230 through the contact holes.

Each of the source electrodes 161 and 261 and the drain electrodes 162 and 262 may include at least one of molybdenum (Mo), aluminum (Al), chromium (Cr), gold (Au), titanium (Ti), nickel (Ni), neodymium (Nd), copper (Cu) or their alloy. Each of the source electrodes 161 and 261 and the drain electrodes 162 and 262 may be formed of a single layer made of a metal or a metal alloy, or may be formed of two or more layers.

According to one embodiment of the present disclosure, any one of the first source electrode 161 and the first drain electrode 162 may be connected to any one of the second source electrode 261 and the second drain electrode 262.

In addition, according to one embodiment of the present disclosure, as shown in FIG. 1, any one of the first source electrode 161 and the first drain electrode 162 may be integrated with any one of the second source electrode 261 and the second drain electrode 262. For example, any one of the first source electrode 161 and the first drain electrode 162 may be formed integrally with, or may be formed one body with, any one of the second source electrode 261 and the second drain electrode 262.

In FIG. 1, the first source electrode 161 is illustrated as being connected to the second source electrode 261. Also, referring to FIG. 1, the first source electrode 161 is illustrated as being integrally formed with the second source electrode 261.

However, one embodiment of the present disclosure is not limited to the above example, and the first drain electrode 162 and the second drain electrode 262 may be connected to each other. In addition, the first drain electrode 162 and the second drain electrode 262 may be integrally formed.

In one embodiment and drawings of the present disclosure, the source electrodes 161 and 261 and the drain electrodes 162 and 262 are only distinguished for convenience of description, but the source electrodes 161 and 261 and the drain electrodes 162 and 262 are not limited by the drawings and the descriptions. The source electrodes 161 and 261 and the drain electrodes 162 and 262 may be interchanged. Each of the source electrodes 161, 261 and the drain electrodes 162, 262 may be referred to individually as a "source/drain electrode." For example, the source electrode 161 may be referred to as the first source/drain electrode 161 of the first thin film transistor TFT1, and the drain electrode 162 may be referred to as the second source/drain electrode 162 of the first thin film transistor TFT1.

In addition, according to one embodiment of the present disclosure, any one of the first source electrode 161 and the first drain electrode 162 and any one of the second source electrode 261 and the second drain electrode 262 may be connected to the first common connection portion 130a and the second common connection portion 230a.

In FIG. 1, the first source electrode 161 and the second source electrode 261 are connected to the first common connection portion 130a and the second common connection portion 230a.

However, one embodiment of the present disclosure is not limited thereto and the first drain electrode 162 and the second drain electrode 262 may be connected to the first common connection portion 130a and the second common connection portion 230a.

According to one embodiment of the present disclosure, the first common connection portion 130a, the second common connection portion 230a, the first active connection portion 130b and the second active connection portion 230b are only distinguished for convenience of description, and may be interchanged. Each of the first common connection portion 130a, the second common connection portion 230a, the first active connection portion 130b and the second active connection portion 230b may serve as a source electrode or a drain electrode.

The first thin film transistor TFT1 may be configured by (e.g., may include) the first active layer 130, the first gate electrode 150, the first source electrode 161 and the first drain electrode 162. The second thin film transistor TFT2 may be configured by (e.g., may include) the second active layer 230, the second gate electrode 250, the second source electrode 261 and the second drain electrode 262.

Figure 2:
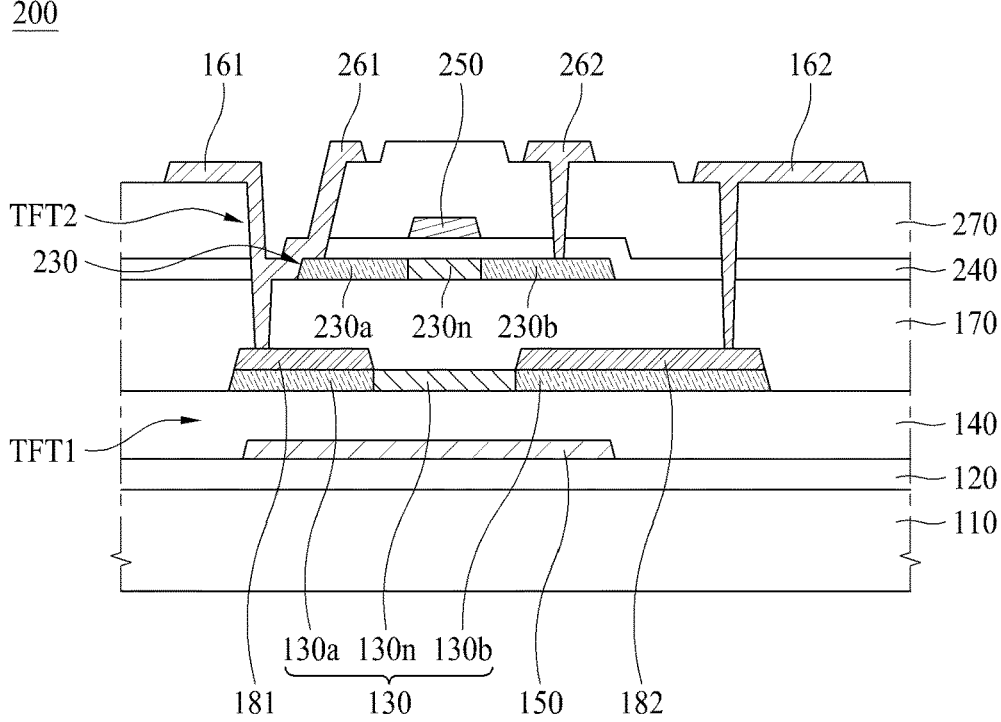
FIG. 2 is a cross-sectional view illustrating a thin film transistor substrate according to another embodiment of the present disclosure.

FIG. 2 is a cross-sectional view illustrating a thin film transistor substrate 200 according to another embodiment of the present disclosure. Hereinafter, in order to avoid redundancy, a description of the elements already described will be omitted.

Referring to FIG. 2, first metal layers 181 and 182 may be disposed on a portion of the first active layer 130. In detail, the thin film transistor substrate 200 according to another embodiment of the present disclosure may further include first metal layers 181 and 182 on the first common connection portion 130a and the first active connection portion 130b, respectively.

According to another embodiment of the present disclosure, the first metal layers 181 and 182 are not disposed on the first channel portion 130n of the first active layer 130.

The first metal layers 181 and 182 may have reductivity. The first metal layers 181 and 182 may selectively reduce the first active layer 130. As a result, the first active layer 130 may be selectively reduced to form the first common connection 130a and the first active connection 130b, which have electrical conductivity close to a conductor.

The first metal layers 181 and 182 may include at least one metal selected from titanium (Ti), molybdenum (Mo), aluminum (Al), silver (Ag), copper (Cu), chromium (Cr), tantalum (Ta), neodymium (Nd), calcium (Ca) or barium (Ba). Also, the first metal layers 181 and 182 may include at least one metal selected from zirconium (Zr), hafnium (Hf), vanadium (V), niobium (Nb), rubidium (Rb), cesium (Cs), magnesium (Mg), calcium (Ca), strontium (Sr), lanthanum (La) or palladium (Pd). For example, the first metal layers 181, 182 may include the metals or alloys thereof. For example, the first metal layers 181, 182 may be multilayer structures having one or more layers of the metals, alloys thereof, or both. The first metal layers 181, 182 may have the same or different composition and ordering of material layers as each other. For example, a first composition may be beneficial for the first common connection 130a, and a second composition different than the first composition may be beneficial for the first active connection 130b.

Figure 3:
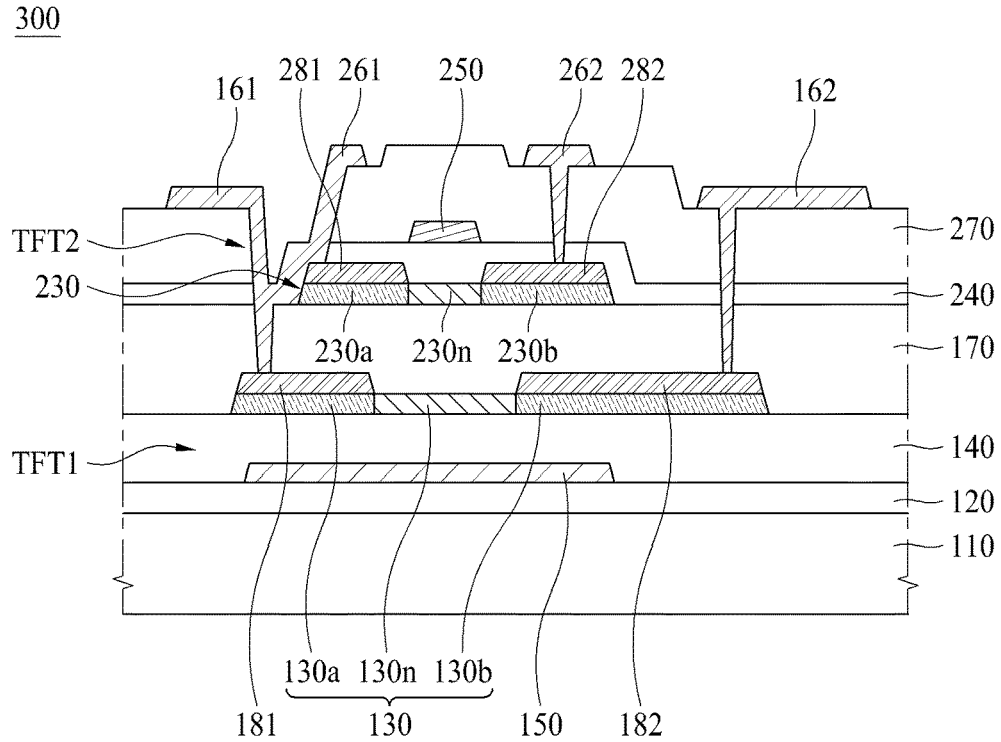
FIG. 3 is a cross-sectional view illustrating a thin film transistor substrate according to still another embodiment of the present disclosure.

FIG. 3 is a cross-sectional view illustrating a thin film transistor substrate 300 according to still another embodiment of the present disclosure.

Referring to FIG. 3, second metal layers 281 and 282 may be disposed on a portion of the second active layer 230. In detail, the thin film transistor substrate 300 according to another embodiment of the present disclosure may further include second metal layers 281 and 282 on the second common connection portion 230a and the second active connection portion 230b.

According to still another embodiment of the present disclosure, the second metal layers 281 and 282 are not disposed in the second channel portion 230n of the second active layer 230.

The second metal layers 281 and 282 may have reductivity. The second metal layers 281 and 282 may selectively reduce the second active layer 230. As a result, the second active layer 230 may be selectively reduced to form the second common connection portion 230a and the second active connection portion 230*b*, which have electrical conductivity close to a conductor.

The second metal layers 281 and 282 may include a metal like the first metal layers 181 and 182. The second metal layers 281 and 282 may have the same composition as that of the first metal layers 181 and 182, and may have a different composition from the first metal layers 181 and 182. The second metal layers 281, 282 may have the same or different composition and ordering of material layers as each other. For example, a third composition may be beneficial for the second common connection 230*a*, and a fourth composition different than the third composition may be beneficial for the second active connection 230*b*.

Figure 4:
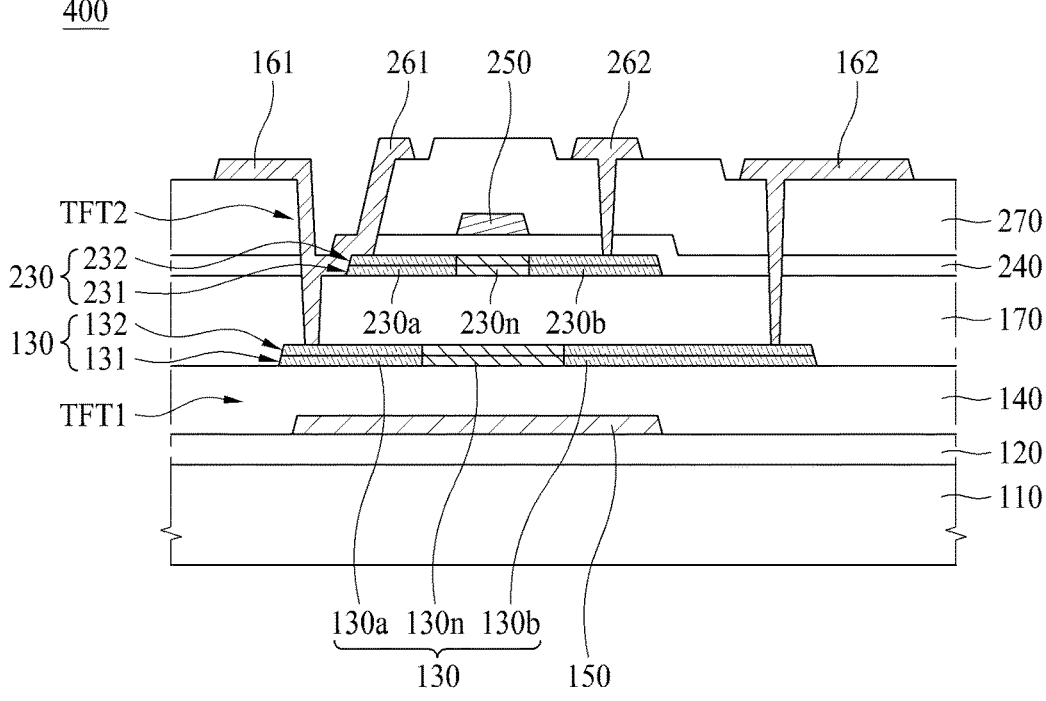
FIG. 4 is a cross-sectional view illustrating a thin film transistor substrate according to further still another embodiment of the present disclosure.

FIG. 4 is a cross-sectional view illustrating a thin film transistor substrate 400 according to further still another embodiment of the present disclosure.

According to further still another embodiment of the present disclosure, at least one of the first active layer 130 or the second active layer 230 may have a multi-layered structure.

According to further still another embodiment of the present disclosure, at least one of the first active layer 130 or the second active layer 230 may include first oxide semiconductor layers 131 and 231 and second oxide semiconductor layers 132 and 232 on the first oxide semiconductor layers 131 and 231. In some embodiments, one or both of the first active layer 130 and the second active layer 230 includes three or more oxide semiconductor layers.

Referring to FIG. 4, the first active layer 130 may include a first oxide semiconductor layer 131 and a second oxide semiconductor layer 132. Also, the second active layer 230 may include a first oxide semiconductor layer 231 and a second oxide semiconductor layer 232, but one embodiment of the present disclosure is not limited thereto, and only one of the first active layer 130 and the second active layer 230 may have a multi-layered structure.

The first oxide semiconductor layers 131 and 231 have excellent film stability to serve as support layers. The first oxide semiconductor layers 131 and 231 may include at least one of, for example, an IGZO (InGaZnO)-based oxide semiconductor material [Ga concentration≥In concentration], a GZO (GaZnO)-based oxide semiconductor material, an IGO (InGaO)-based oxide semiconductor material or a GZTO (GaZnSnO)-based oxide semiconductor material.

The second oxide semiconductor layers 132 and 232 may have excellent mobility. The second oxide semiconductor layers 132 and 232 may be made of an oxide semiconductor material having high mobility characteristics. The second oxide semiconductor layers 132 and 232 may serve as main channel layers.

The second oxide semiconductor layers 132 and 232 may include at least one of, for example, an IGZO (InGaZnO)-based oxide semiconductor material, an IZO (InZnO)-based oxide semiconductor material, an IGZTO (InGaZnSnO)-based oxide semiconductor material, an ITZO (InSnZnO)-based oxide semiconductor material, a FIZO (FeInZnO)-based oxide semiconductor material, a ZnO-based oxide semiconductor material, a SIZO (SiInZnO)-based oxide semiconductor material or a ZnON (Zn-Oxynitride)-based oxide semiconductor material.

However, one embodiment of the present disclosure is not limited to the above example, and the first oxide semiconductor layers 131 and 231 may serve as main channel layers. In addition, according to another embodiment of the present disclosure, the first active layer 130 and the second active layer 230 may have a multi-layered structure of three or more layers, and a third oxide semiconductor layer may be disposed on the second oxide semiconductor layers 132 and 232.

Figure 5:
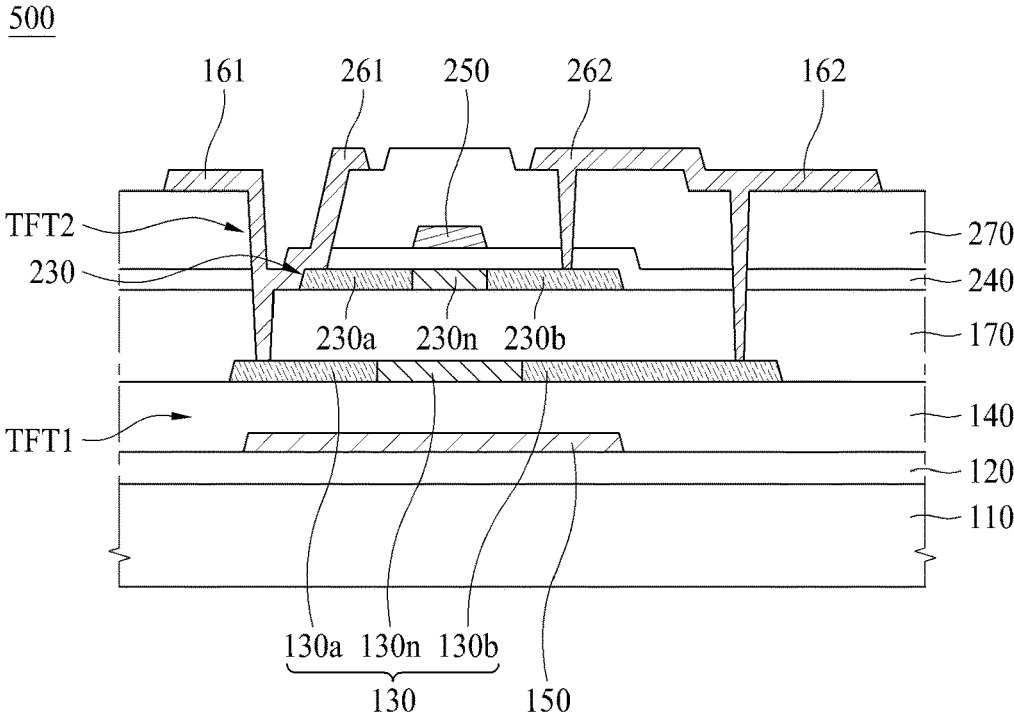
FIG. 5 is a cross-sectional view illustrating a thin film transistor substrate according to further still another embodiment of the present disclosure.

FIG. 5 is a cross-sectional view illustrating a thin film transistor substrate 500 according to further still another embodiment of the present disclosure.

According to further still another embodiment of the present disclosure, the other one of the first source electrode 161 and the first drain electrode 162 may be connected to the other one of the second source electrode 261 and the second drain electrode 262.

Referring to FIG. 5, the first drain electrode 162 and the second drain electrode 262 may be connected to each other. According to further still another embodiment of the present disclosure, the first drain electrode 162 of the first thin film transistor TFT1 and the second drain electrode 262 of the second thin film transistor TFT2 may be connected to the same line, and the same signal may be applied to the first drain electrode 162 of the first thin film transistor TFT1 and the second drain electrode 262 of the second thin film transistor TFT2. The first drain electrode 162 and the second drain electrode 262 may be integrally formed.

In addition, according to further still another embodiment of the present disclosure, the first source electrode 161 may be connected to the second source electrode 261. Referring to FIG. 5, the first source electrode 161 and the second source electrode 261 may be integrally formed.

Figure 6:
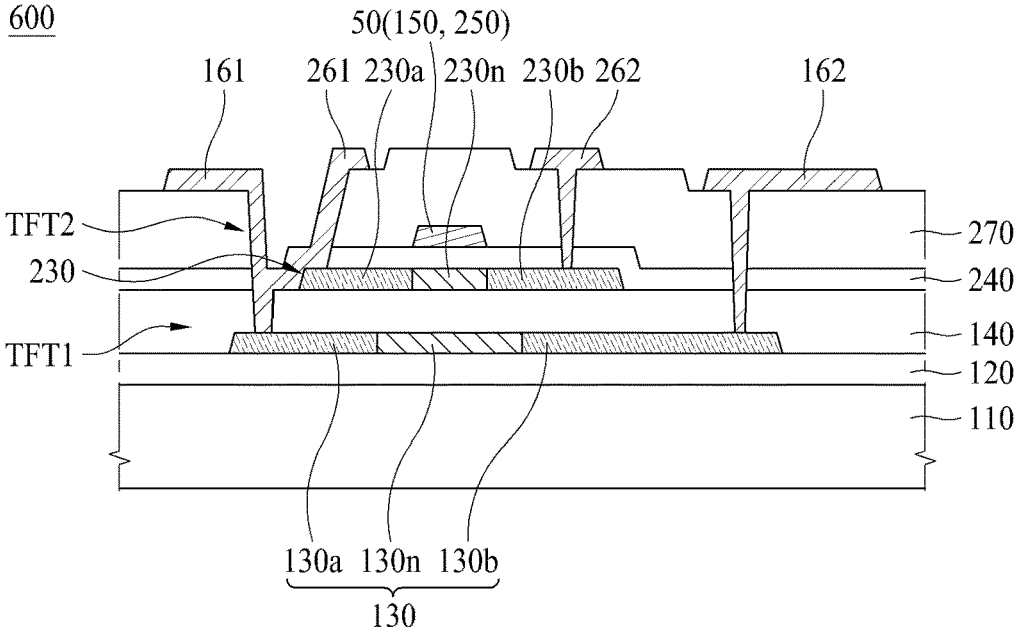
FIG. 6 is a cross-sectional view illustrating a thin film transistor substrate according to further still another embodiment of the present disclosure.

FIG. 6 is a cross-sectional view illustrating a thin film transistor substrate 600 according to another embodiment of the present disclosure.

Referring to FIG. 6, the first gate electrode 150 and the second gate electrode 250 may be integrally formed to constitute a common gate electrode 50. According to one embodiment of the present disclosure, the same gate voltage may be applied to the first thin film transistor TFT1 and the second thin film transistor TFT2.

According to one embodiment of the present disclosure, the first thin film transistor TFT1 and the second thin film transistor TFT2 may be turned on at the same time. In detail, the first thin film transistor TFT1 and the second thin film transistor TFT2 may be simultaneously turned on by the gate voltage applied to the common gate electrode 50. It should be understood that "simultaneously turned on" includes the meaning of being turned on at substantially the same time. For example, the second thin film transistor TFT2 may turn on slightly earlier than the first thin film transistor TFT1 due to the common gate electrode 50 being in closer proximity to the second active layer 230 than to the first active layer 130, or due to other differences in electrical characteristics of the first and second thin film transistors TFT1, TFT2 (e.g., parasitic capacitances, channel lengths, or the like).

Referring to FIG. 6, the common gate electrode 50 may be disposed on the second active layer 230. In more detail, the common gate electrode 50 may be disposed on the second gate insulating layer 240.

According to one embodiment of the present disclosure, since the first thin film transistor TFT1 and the second thin film transistor TFT2 are simultaneously driven, the passivation layer 170 does not need to be disposed between the first active layer 130 and the second active layer 230. In detail, the passivation layer 170 serving to allow the first active layer 130 and the second active layer 230 not to interfere with each other may be omitted.

Referring to FIG. 6, the first gate insulating layer 140 may be disposed on the first active layer 130, and the second active layer 230 may be disposed on the first gate insulating layer 140.

The common gate electrode 50 may overlap at least a portion of the first active layer 130 and at least a portion of the second active layer 230. The common gate electrode 50 may overlap the first channel portion 130$n$ of the first active layer 130 and the second channel portion 230$n$ of the second active layer 230.

Figure 7:
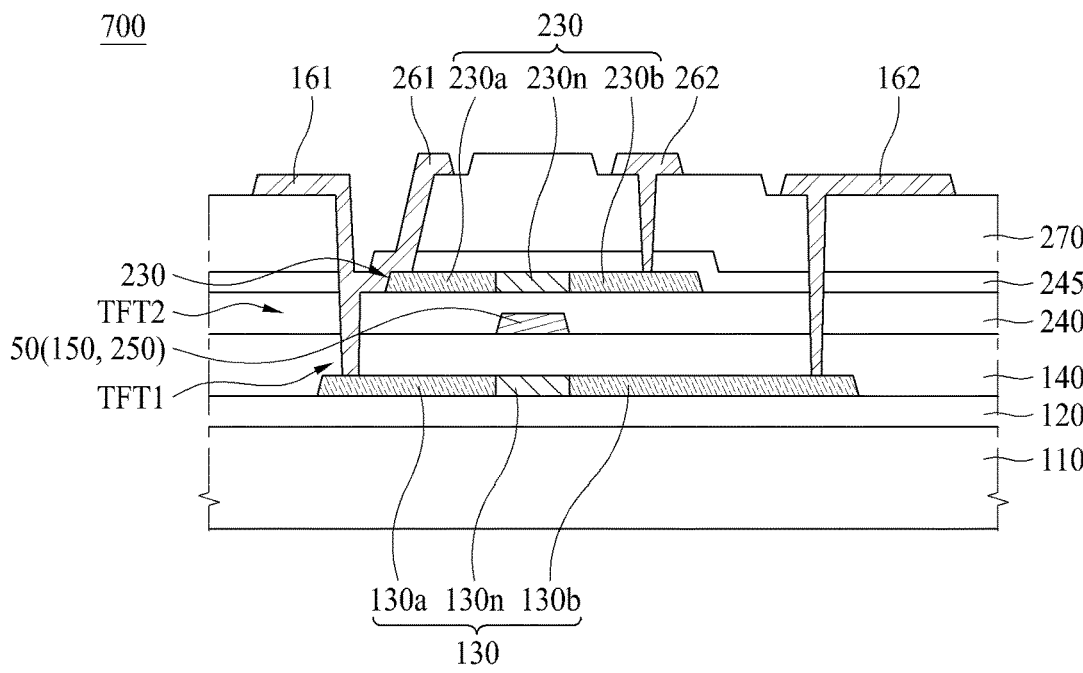
FIG. 7 is a cross-sectional view illustrating a thin film transistor substrate according to further still another embodiment of the present disclosure.

FIG. 7 is a cross-sectional view illustrating a thin film transistor substrate 700 according to further still another embodiment of the present disclosure.

Referring to FIG. 7, the common gate electrode 50 may be disposed between the first active layer 130 and the second active layer 230, and the first thin film transistor TFT1 and the second thin film transistor TFT2 may be simultaneously turned on by the gate voltage applied to the common gate electrode 50. It should be understood that "simultaneously turned on" includes the meaning of being turned on at substantially the same time. For example, the second thin film transistor TFT2 may turn on slightly earlier than the first thin film transistor TFT1 due to the common gate electrode 50 being in closer proximity to the second active layer 230 than to the first active layer 130, or due to other differences in electrical characteristics of the first and second thin film transistors TFT1, TFT2 (e.g., parasitic capacitances, channel lengths, or the like).

Referring to FIG. 7, the first gate insulating layer 140 may be disposed on the first active layer 130, and the common gate electrode 50 may be disposed on the first gate insulating layer 140. The second gate insulating layer 240 may be disposed on the common gate electrode 50, and the second active layer 230 may be disposed on the second gate insulating layer 240. An interlayer insulating layer 245 may be disposed on the second active layer 230.

The common gate electrode 50 may overlap at least a portion of the first active layer 130 and at least a portion of the second active layer 230. The common gate electrode 50 may overlap the first channel portion 130$n$ of the first active layer 130 and the second channel portion 230$n$ of the second active layer 230.

Figure 8:
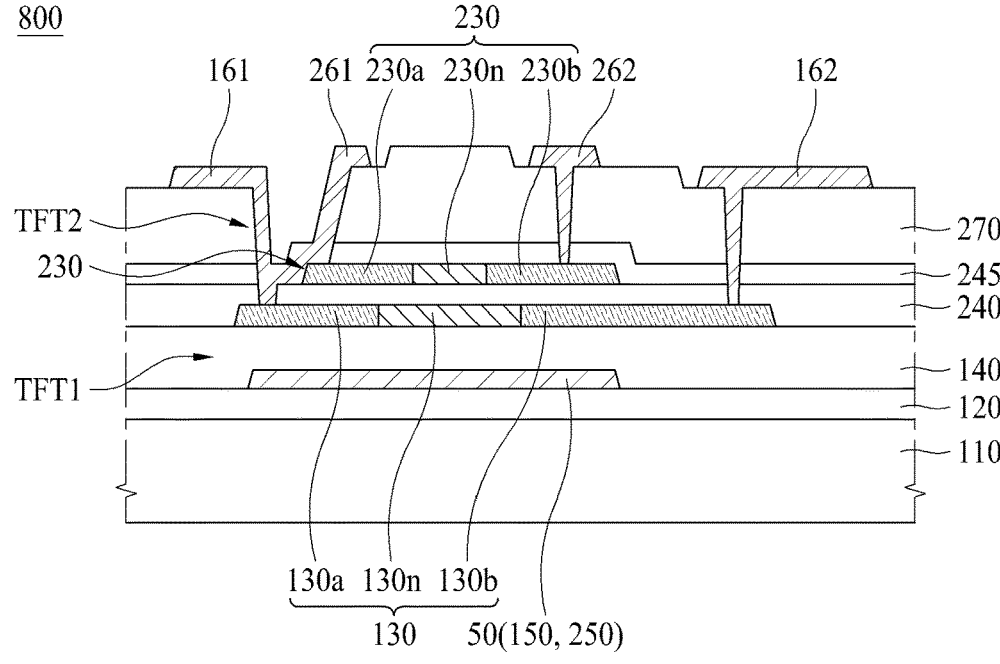
FIG. 8 is a cross-sectional view illustrating a thin film transistor substrate according to further still another embodiment of the present disclosure.

FIG. 8 is a cross-sectional view illustrating a thin film transistor substrate 800 according to further still another embodiment of the present disclosure.

Referring to FIG. 8, the common gate electrode 50 may be disposed between the first active layer 130 and the base substrate 110, and the first thin film transistor TFT1 and the second thin film transistor TFT2 may be simultaneously turned on by the gate voltage applied to the common gate electrode 50. It should be understood that "simultaneously turned on" includes the meaning of being turned on at substantially the same time. For example, the first thin film transistor TFT1 may turn on slightly earlier than the second thin film transistor TFT2 due to the common gate electrode 50 being in closer proximity to the first active layer 130 than to the second active layer 230, or due to other differences in electrical characteristics of the first and second thin film transistors TFT1, TFT2 (e.g., parasitic capacitances, channel lengths, or the like).

Referring to FIG. 8, the common gate electrode 50 may be disposed on the buffer layer 120, and the first gate insulating layer 140 may be disposed on the common gate electrode 50. The first active layer 130 may be disposed on the first gate insulating layer 140, and the second gate insulating layer 240 may be disposed on the first active layer 130. The second active layer 230 may be disposed on the second gate insulating layer 240. The interlayer insulating layer 245 may be disposed on the second active layer 230.

The common gate electrode 50 may overlap at least a portion of the first active layer 130 and at least a portion of the second active layer 230. The common gate electrode 50 may overlap the first channel portion 130$n$ of the first active layer 130 and the second channel portion 230$n$ of the second active layer 230.

Hereinafter, a display device to which the above-described thin film transistor substrates 100, 200, 300, 400, 500, 600, 700 and 800 are applied will be described in detail.

Figure 9:
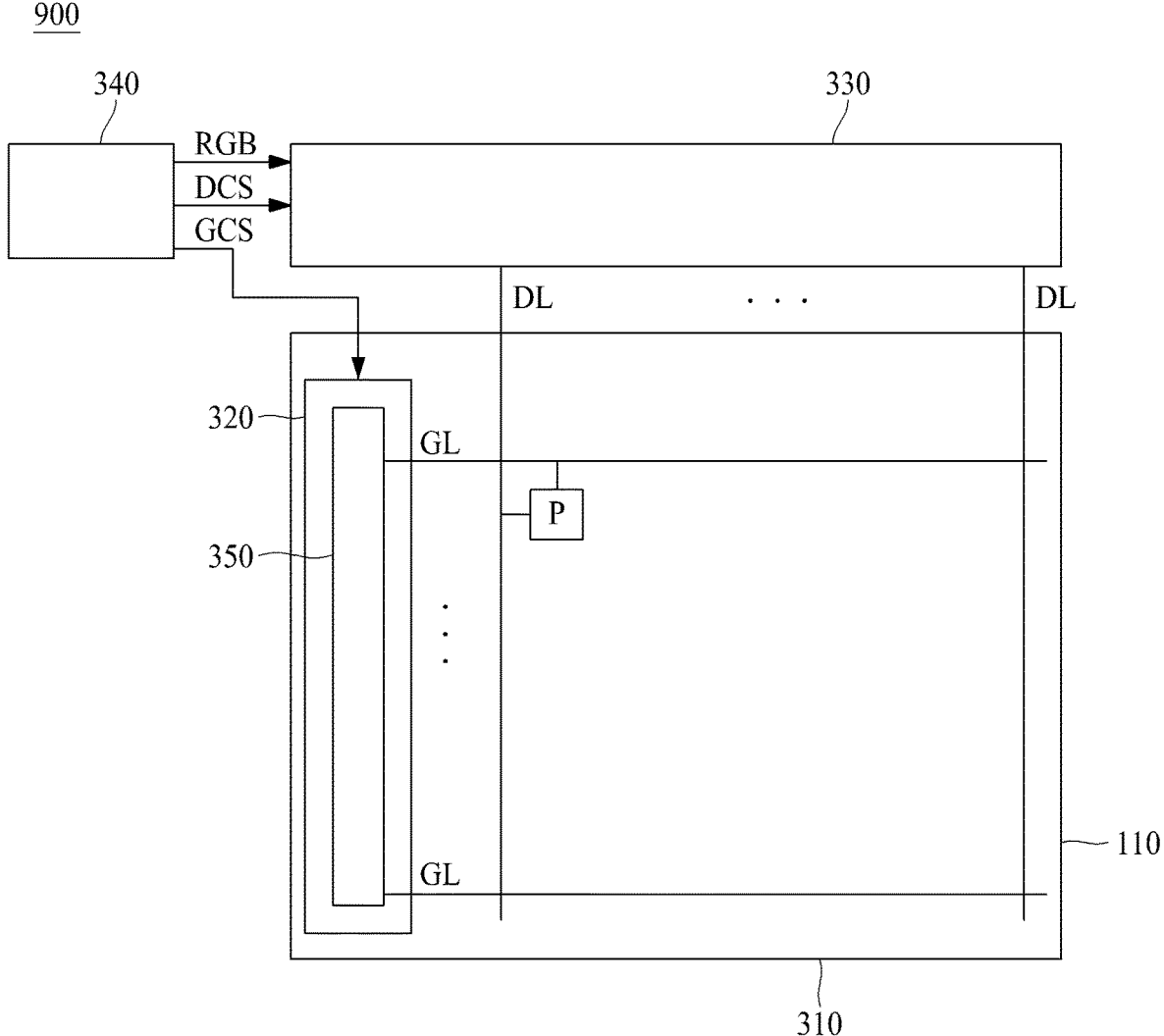
FIG. 9 is a schematic view illustrating a display device according to another embodiment of the present disclosure.

FIG. 9 is a schematic view illustrating a display device 900 according to further still another embodiment of the present disclosure.

As shown in FIG. 9, the display device 900 according to further still another embodiment of the present disclosure includes a display panel 310, a gate driver 320, a data driver 330 and a controller 340.

The display panel 310 includes gate lines GL and data lines DL, and pixels P are disposed in overlap areas of the gate lines GL and the data lines DL. An image is displayed by driving of the pixels P. The gate lines GL, the data lines DL and the pixel may be disposed on the base substrate 110.

The controller 340 controls the gate driver 320 and the data driver 330.

The controller 340 outputs a gate control signal GCS for controlling the gate driver 320 and a data control signal DCS for controlling the data driver 330 by using a signal that is supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE and a polarity control signal POL.

The data driver 330 supplies a data voltage to the data lines DL of the display panel 310. In detail, the data driver 330 converts the image data RGB input from the controller 340 into an analog data voltage, and supplies the data voltage to the data lines DL.

According to one embodiment of the present disclosure, the gate driver 320 may be packaged on the display panel 310. In this way, a structure in which the gate driver 320 is directly packaged on the display panel 310 will be referred to as a Gate In Panel (GIP) structure. In detail, in the gate in panel (GIP) structure, the gate driver 320 may be disposed on the base substrate 110.

The display device 900 according to one further still another embodiment of the present disclosure may include at least one of the above-described thin film transistor substrates 100, 200, 300, 400, 500, 600, 700 or 800. According to one embodiment of the present disclosure, the gate driver 320 may include the first thin film transistor TFT1 and the second thin film transistor TFT2 of the above-described thin film transistor substrates 100, 200, 300, 400, 500, 600, 700 and 800.

The gate driver 320 may include a shift register 350.

The shift register 350 sequentially supplies gate pulses to the gate lines GL for one frame by using the start signal and the gate clock, which are transmitted from the controller 340. In this case, one frame means a time period at which one image is output through the display panel 310. The gate pulse has a turn-on voltage that may turn on a switching element (thin film transistor) disposed in the pixel P.

Also, the shift register 350 supplies a gate-off signal capable of turning off the switching element, to the gate line GL for the other period of one frame, at which the gate pulse is not supplied. Hereinafter, the gate pulse and the gate-off signal will collectively be referred to as a scan signal SS or Scan.

The shift register 350 may include the first thin film transistor TFT1 and the second thin film transistor TFT2 of the above-described thin film transistor substrates 100, 200, 300, 400, 500, 600, 700 and 800.

Figure 10:
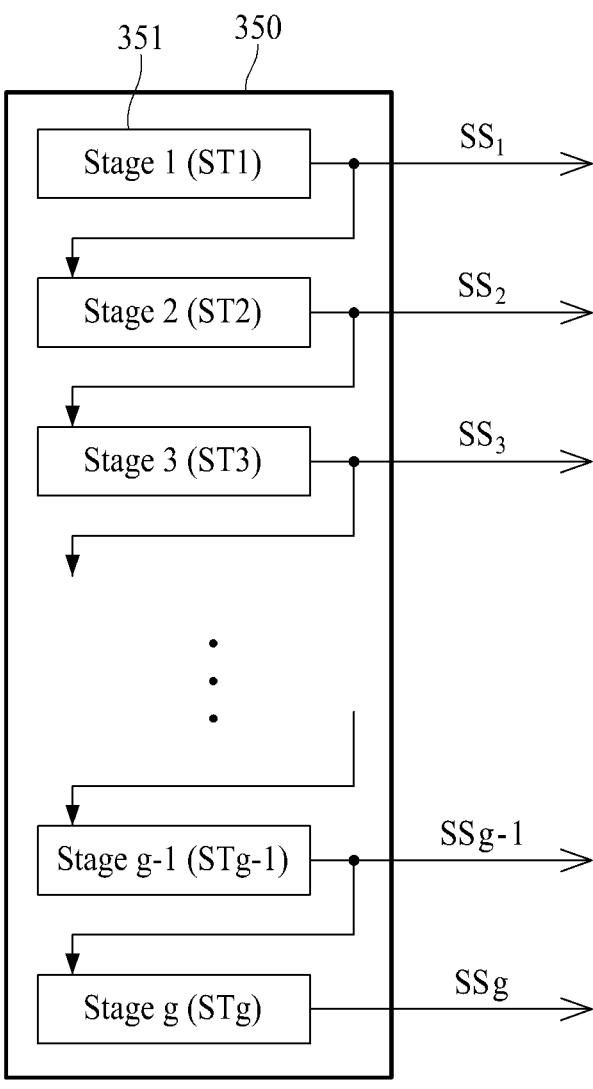
FIG. 10 is a schematic view illustrating a shift register.
Figure 11:
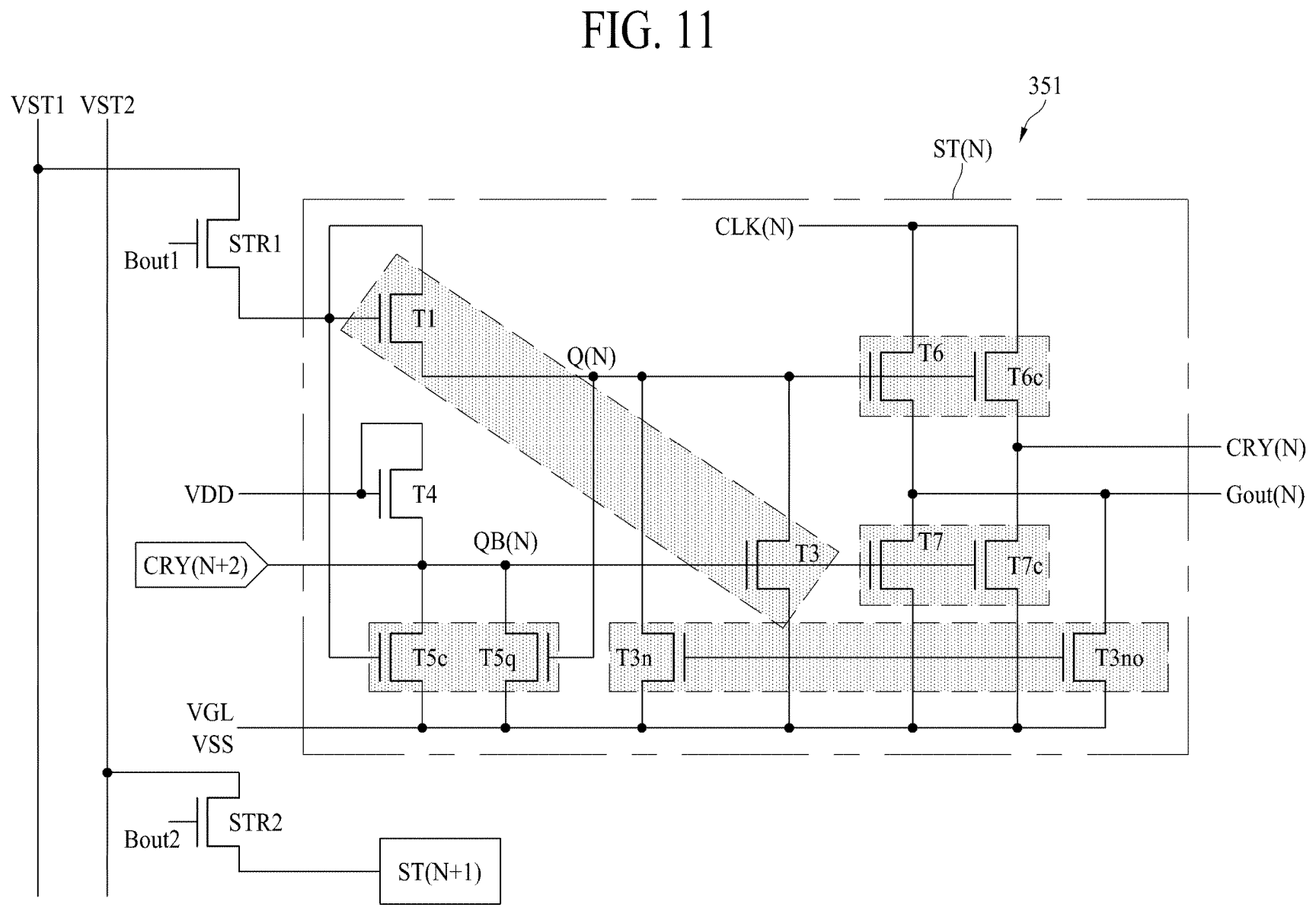

FIG. 10 is a schematic view illustrating a shift register 350. FIG. 11 is a circuit diagram illustrating a stage provided in the shift register 350 of FIG. 10.

Referring to FIG. 10, the shift register 350 may include g stages 351, labeled as ST1, ST2, ST3, . . . , STg−1, STg. The term "g" is an integer greater than 1, but can be any value, such as 1080, 2160, or other suitable integer.

The shift register 350 transmits one scan signal SS to pixels P connected to one gate line GL through one gate line GL. Each of the stages 351 may be connected to one gate line GL. When g gate lines GL are formed in the display panel 110, the shift register 350 may include g stages 351 ST1 to STg, and may generate g scan signals SS1 to SSg.

In general, each stage 351 outputs the gate pulse GP once during one frame, and the gate pulses GP are sequentially output from each stage 351.

Each of the stages 351 for sequentially outputting the gate pulses GP may include pull-up transistors T6 and T6c, pull-down transistors T3, T7 and T7c, start transistors STR1 and STR2, reset transistors T3n and T3no, and switching transistors T1, T4, T5c and T5q, as shown in FIG. 11.

In detail, FIG. 11 shows a circuit diagram of an (N)th stage [ST(N)] included in the shift register 350 of the gate driver 320. The (N)th stage [ST(N)] may be disposed in series with a (N+1)th stage [ST(N+1)].

The (N)th stage [ST(N)] includes a Q node [Q(N)] and a QB node [QB(N)] one by one. The Q node [Q(N)] and the QB node [QB(N)] are charged and discharged with a high potential power voltage VDD or a low potential power voltage VSS. A gate-ON voltage VGH is applied to a VDD terminal, and a gate-off voltage VGL is applied to a VSS terminal. CRY(N+2) is a carry signal provided from a stage after two stages, e.g., a (N+2)th stage [ST(N+2)].

A circuit of the (N)th stage [ST(N)] and the (N+1)th stage [ST(N+1)] may include pull-up transistors T6 and T6c connected to the Q node[Q(N)], pull-down transistors T3, T7 and T7c connected to the QB node [(QB(N)), reset transistors T3n and T3no turned on by a carry signal (CRY(N+4)), and switch circuits T1, T4, T5c and T5q.

The Q node [Q(N)] of the (N)th stage [ST(N)] and the (N+1)th stage [ST(N+1)] may be charged by being triggered by applying of the start voltage VST1 and VST2, respectively.

In detail, a start input terminal, which is a gate terminal of the switching transistor T1 of the (N)th stage [ST(N)], may be connected to a source terminal of the start transistor STR1.

The start transistor STR1 may be turned on by an output voltage Bout1 of a branch circuit connected to the (N)th stage [ST(N)]. A voltage of a start voltage VST1 to which a drain terminal of the start transistor STR1 is connected may be raised to the gate-ON voltage VGH in the same manner as a timing of the output voltage Bout1 of the bridge circuit. The voltage of the Q node [Q(N)] is also precharged with the gate-ON voltage VGH by the switching transistor T1 that is turned on.

Subsequently, the start transistor STR2 of the (N+1)th stage [ST(N+1)] is turned on by an output voltage Bout2 and a start voltage VST2 of other bridge circuit, and the Q node may be precharged.

When a clock signal [CLK(N)] is input to drains of the pull-up transistors T6 and T6c, the voltage of the Q node [Q(N)] may be raised to a voltage higher than the gate-ON voltage VGH by bootstrapping, for example, as much as 2VGH. At this time, the pull-up transistors T6 and T6c are turned on by the voltage of the Q node [Q(N)] so that an output voltage Gout(N) and a carry signal CRY(N) may be raised to the VGH.

As shown in FIG. 11, the shift register 350 included in the gate driver 320 or the gate driver 320 occupies a large area of a large number of thin film transistors.

In the GIP structure in which the gate driver 320 is disposed on the same base substrate 110 as the pixel P, it is beneficial that the gate driver 320 has a small area if possible. Therefore, in the case that the first thin film transistor TFT1 and the second thin film transistor TFT2 are stacked in the same manner as the film transistor substrates 100, 200, 300, 400, 500, 600, 700 and 800 according to the embodiments of the present disclosure, a large number of thin film transistors may be disposed in a narrow area.

According to one embodiment of the present disclosure, the gate driver 320 includes two or more pull-up transistors T6 and T6c, and the first thin film transistor TFT1 and the second thin film transistor TFT2 of the above-described thin film transistor substrates 100, 200, 300, 400, 500, 600, 700 and 800 may be applied to the pull-up transistors T6 and T6c of the gate driver 320, respectively. In detail, the two pull-up transistors T6 and T6c shown in FIG. 11 may overlap each other.

According to one embodiment of the present disclosure, the gate driver 320 includes two or more pull-down transistors T3, T7 and T7c, and the first thin film transistor TFT1 and the second thin film transistor TFT2 of the above-described thin film transistor substrates 100, 200, 300, 400, 500, 600, 700 and 800 may be applied to the pull-down transistors T7 and T7c of the gate driver 320, respectively.

In detail, T7 and T7c among the pull-down transistors T3, T7 and T7c shown in FIG. 11 may be disposed to overlap each other.

According to one embodiment of the present disclosure, the gate driver 320 includes two or more reset transistors T3n and T3no, and the first thin film transistor TFT1 and the second thin film transistor TFT2 of the above-described thin film transistor substrates 100, 200, 300, 400, 500, 600, 700 and 800 may be applied to the reset transistors T3n and T3no of the gate driver 320, respectively. In detail, the two reset transistors T3n and T3no shown in FIG. 11 may be disposed to overlap each other.

According to one embodiment of the present disclosure, the gate driver 320 includes two or more switching transistors T1, T4, T5c and T5q, and the first thin film transistor TFT1 and the second thin film transistor TFT2 of the above-described thin film transistor substrates 100, 200, 300, 400, 500, 600, 700 and 800 may be applied to the switching transistors T1, T4, T5c and T5q of the gate driver 320, respectively.

In detail, T5c and T5q of the switching transistors T1, T4, T5c and T5q shown in FIG. 11 may be disposed to overlap each other.

Figure 12:
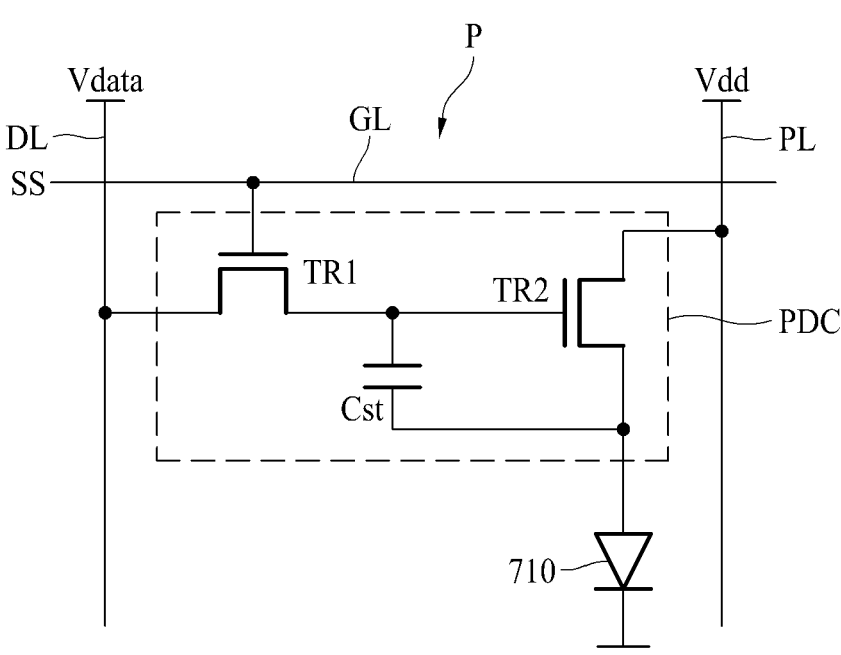
FIG. 12 is a circuit diagram of any one pixel in FIG. 9.

FIG. 12 is a circuit diagram of any one pixel P in FIG. 9.

The circuit diagram of FIG. 12 is an equivalent circuit diagram for the pixel P of the display device 900 that includes an organic light emitting diode (OLED) as a display element 710.

Referring to FIG. 12, the pixel P includes a display element 710 and a pixel driving circuit PDC for driving the display element 710. In detail, the display device 900 according to one embodiment of the present disclosure may include a pixel driving circuit PDC on the base substrate 110.

The pixel driving circuit PDC of FIG. 12 includes a first thin film transistor TR1 that is a switching transistor and a second thin film transistor TR2 that is a driving transistor.

The first thin film transistor TR1 is connected to the gate line GL and the data line DL, and is turned on or off by the scan signal SS supplied through the gate line GL.

The data line DL provides the data voltage Vdata to the pixel driving circuit PDC, and the first thin film transistor TR1 controls applying of the data voltage Vdata.

The driving power line PL provides the driving voltage Vdd to the display element 710, and the first thin film transistor TR1 controls the driving voltage Vdd. The driving voltage Vdd is a pixel driving voltage for driving the organic light emitting diode (OLED) that is the display element 710.

When the second thin film transistor TR2 is turned on by the scan signal SS applied from the gate driver 320 through the gate line GL, the data voltage Vdata supplied through the data line DL is supplied to the gate electrode of the second thin film transistor TR2 connected to the display element 710. The data voltage Vdata is charged in a storage capacitor Cst formed between the gate electrode and the source electrode of the second thin film transistor TR2.

The amount of the current supplied to the organic light emitting diode (OLED), which is the display element 710, is controlled through the second thin film transistor TR2 in accordance with the data voltage Vdata, whereby a gray scale of light output from the display element 710 may be controlled.

Figure 13:
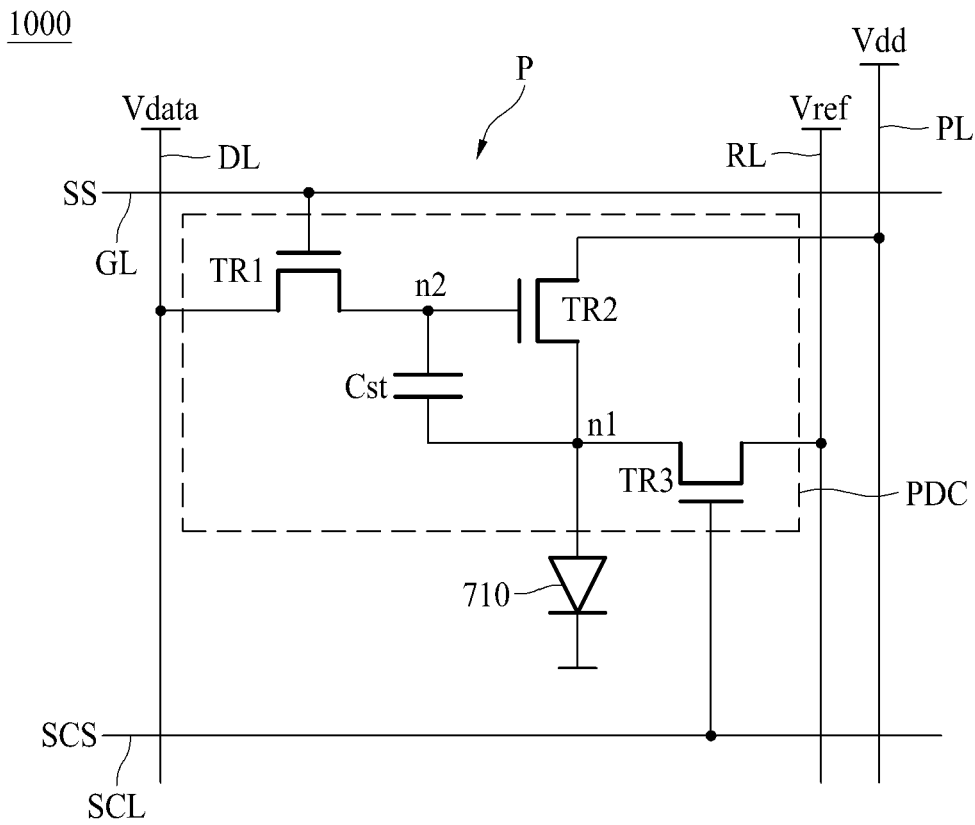
FIG. 13 is a circuit diagram illustrating any one pixel of a display device according to still another embodiment of the present disclosure.

FIG. 13 is a circuit diagram illustrating any one pixel P of a display device 1000 according to still another embodiment of the present disclosure.

FIG. 13 is an equivalent circuit diagram for the pixel P of an organic light emitting display device.

The pixel P of the display device 1000 shown in FIG. 13 includes an organic light emitting diode (OLED) that is a display element 710 and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

The pixel driving circuit PDC includes, for example, a first thin film transistor TR1 (switching transistor) connected with the gate line GL and the data line DL, a second thin film transistor TR2 (driving transistor) for controlling a magnitude of a current output to the display element 710 in accordance with the data voltage Vdata transmitted through the first thin film transistor TR1, and a third thin film transistor TR3 (sensing transistor) for sensing characteristics of the second thin film transistor TR2.

The first thin film transistor TR1 is turned on by the scan signal SS supplied to the gate line GL to transmit the data voltage Vdata, which is supplied to the data line DL, to the gate electrode of the second thin film transistor TR2.

The third thin film transistor TR3 is connected to a first node n1 between the second thin film transistor TR2 and the display element 710 and the reference line RL, and thus is turned on or off by the sensing control signal SCS and senses characteristics of the second thin film transistor TR2, which is a driving transistor, for a sensing period.

A second node n2 connected with the gate electrode of the second thin film transistor TR2 is connected with the first thin film transistor TR1. A storage capacitor Cst is formed between the second node n2 and the first node n1.

When the first thin film transistor TR1 is turned on, the data voltage Vdata supplied through the data line DL is supplied to the gate electrode G2 of the second thin film transistor TR2. The data voltage Vdata is charged in the storage capacitor Cst formed between the gate electrode and the source electrode of the second thin film transistor TR2.

When the second thin film transistor TR2 is turned on, the current is supplied to the display element 710 through the second thin film transistor TR2 in accordance with the driving voltage Vdd for driving the pixel, whereby light is output from the display element 710.

Figure 14:
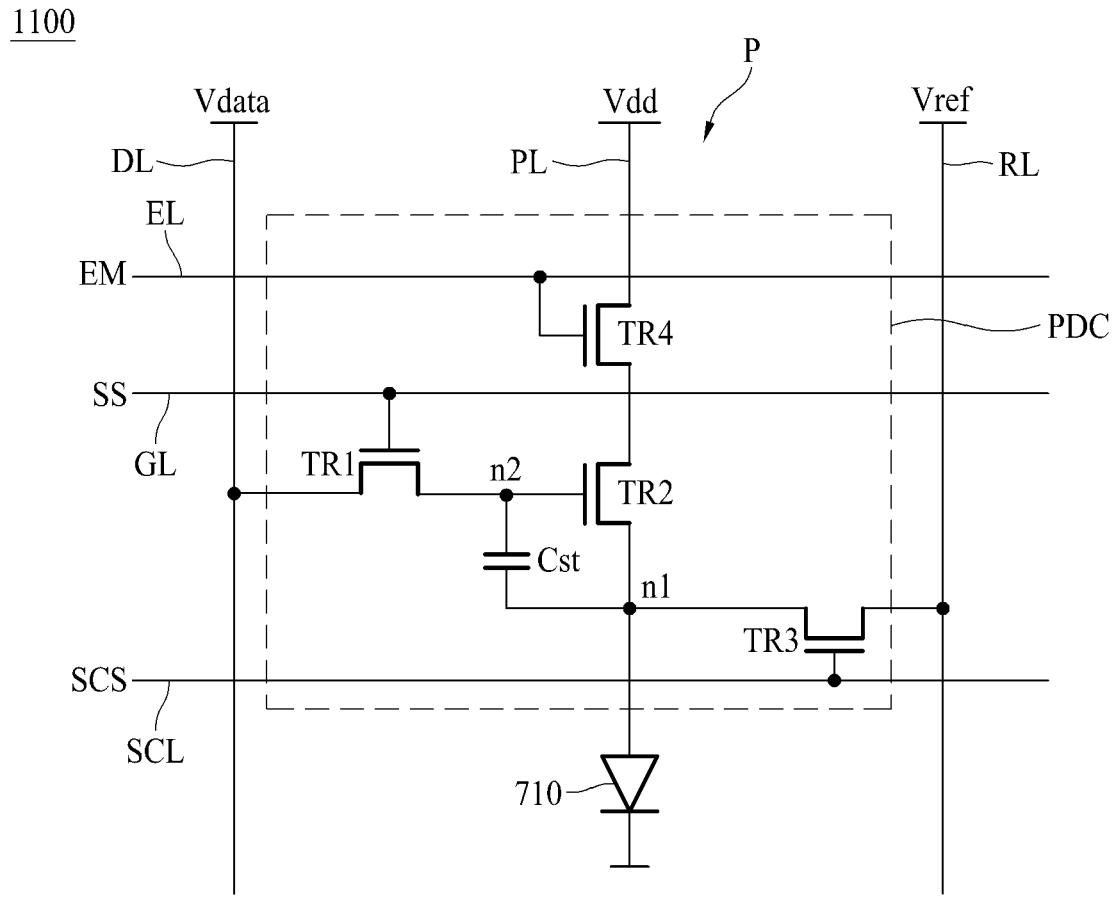
FIG. 14 is a circuit diagram illustrating any one pixel of a display device according to further still another embodiment of the present disclosure.

FIG. 14 is a circuit diagram illustrating a pixel of a display device 1100 according to further still another embodiment of the present disclosure.

The pixel P of the display device 1100 shown in FIG. 14 includes an organic light emitting diode (OLED) that is a display element 710 and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 13, the pixel P of FIG. 14 further includes an emission control line EL. An emission control signal EM is supplied to the emission control line EL. Also, the pixel driving circuit PDC of FIG. 14 further includes a fourth thin film transistor TR4 that is an emission control transistor for controlling a light emission timing of the second thin film transistor TR2, in comparison with the pixel driving circuit PDC of FIG. 13.

The first thin film transistor TR1 is turned on by the scan signal SS supplied to the gate line GL to transmit the data voltage Vdata, which is supplied to the data line DL, to the gate electrode of the second thin film transistor TR2.

A storage capacitor Cst is positioned between the gate electrode of the second thin film transistor TR2 and the display element 710.

The third thin film transistor TR3 is connected to the reference line RL, and thus is turned on or off by the sensing control signal SCS and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM or shields the driving voltage Vdd. When the fourth thin film transistor TR4 is turned on, a current is supplied to the second thin film transistor TR2, whereby light is output from the display element 710.

The pixel driving circuit PDC according to further still another embodiment of the present disclosure may be formed in various structures in addition to the above-described structure. The pixel driving circuit PDC may include, for example, five or more thin film transistors.

According to further still another embodiment of the present disclosure, the display device includes a pixel driving circuit PDC on the base substrate 110, and the pixel driving circuit PDC may include a first thin film transistor TFT1 and a second thin film transistor TFT2 of the above-described thin film transistor substrates 100, 200, 300, 400, 500, 600, 700 and 800. In more detail, the pixel driving circuit PDC includes two or more thin film transistors, and the two or more thin film transistors may be stacked to share at least one signal line. In addition, the pixel driving circuit PDC may include an internal compensation circuit.

According to the present disclosure, the following advantageous effects may be obtained.

According to one embodiment of the present disclosure, the thin film transistors may be disposed to be stacked, so that a large number of thin film transistors may be disposed in the same area and the arrangement area of the thin film transistors may be reduced.

According to one embodiment of the present disclosure, the plurality of thin film transistors connected to the same line may be disposed to be stacked up and down, whereby efficiency in line connection may be improved and the arrangement area of the thin film transistors may be reduced.

According to one embodiment of the present disclosure, the thin film transistors may be disposed to be stacked, so that the area of the gate driver may be reduced. As the area of the gate driver becomes narrow, the size of the bezel area may be reduced in the display device.

In addition, according to one embodiment of the present disclosure, as the thin film transistors are disposed to be stacked, a large number of thin film transistors may be disposed in the pixel driving circuit, and arrangement efficiency of the thin film transistors may be improved. As a result, the internal compensation circuit of the pixel may be easily implemented.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, it is intended that all variations or modifications derived from the meaning, scope and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A thin film transistor substrate comprising:
a first thin film transistor on a base substrate; and
a second thin film transistor on the first thin film transistor,
wherein the first thin film transistor includes:
  a first active layer on the base substrate;
  a first gate electrode spaced apart from the first active layer, the first gate electrode not being electrically connected to the first active layer; and
  a first source electrode and a first drain electrode, which are spaced apart from each other and connected to the first active layer,
the second thin film transistor includes:
  a second active layer on the base substrate;
  a second gate electrode spaced apart from the second active layer; and
  a second source electrode and a second drain electrode, which are spaced apart from each other and connected to the second active layer, and
  wherein the first thin film transistor and the second thin film transistor are vertically stacked, and
all of the first active layer, the first gate electrode, the second active layer, and the second gate electrode overlap with each other, the first active layer and the second active layer are each vertically between the first gate electrode and the second gate electrode, and the first active layer and the second active layer each overlapping with both the first gate electrode and the second gate electrode, and
wherein one of the first source electrode and the first drain electrode is connected to one of the second source electrode and the second drain electrode,
the one of the first source electrode and the first drain electrode is integrally formed with the one of the second source electrode and the second drain electrode, and
the one of the second source electrode and the second drain electrode contacts a side surface of the second active layer.

2. The thin film transistor substrate of claim 1, wherein the first gate electrode is disposed between the base substrate and the first active layer, and
the second active layer is disposed between the first active layer and the second gate electrode.

3. The thin film transistor substrate of claim 1, wherein a distance between the first active layer and the second active layer is greater than a distance between the first active layer and the first gate electrode and greater than a distance between the second active layer and the second gate electrode.

4. The thin film transistor substrate of claim 1, wherein the first active layer includes:
  a first channel portion overlapped with the first gate electrode;
  a first common connection portion connected to one side of the first channel portion; and
  a first active connection portion connected to the other side of the first channel portion;
the second active layer includes:
  a second channel portion overlapped with the second gate electrode;
  a second common connection portion connected to one side of the second channel portion; and a second active connection portion connected to the other side of the second channel portion; and one of the first source electrode and the first drain electrode and one of the second source electrode and the second drain electrode are connected to the first common connection portion and the second common connection portion.

5. The thin film transistor substrate of claim 4, further comprising a first metal layer on the first common connection portion and the first active connection portion.

6. The thin film transistor substrate of claim 4, further comprising a second metal layer on the second common connection portion and the second active connection portion.

7. The thin film transistor substrate of claim 1, wherein the other one of the first source electrode and the first drain electrode is connected to the other one of the second source electrode and the second drain electrode.

8. The thin film transistor substrate of claim 1, wherein at least one of the first active layer or the second active layer includes an oxide semiconductor material.

9. The thin film transistor substrate of claim 1, wherein each of the first active layer and the second active layer includes an oxide semiconductor material, and the first active layer has mobility different than that of the second active layer.

10. The thin film transistor substrate of claim 1, wherein at least one of the first active layer or the second active layer includes:

a first oxide semiconductor layer; and a second oxide semiconductor layer on the first oxide semiconductor layer.

11. A display device comprising:

a thin film transistor substrate including:

a base substrate;

a first thin film transistor on the base substrate; and a second thin film transistor on the first thin film transistor;

wherein the first thin film transistor includes:

a first active layer on the base substrate;

a first gate electrode spaced apart from the first active layer, the first gate electrode not being electrically connected to the first active layer; and a first source electrode and a first drain electrode, which are spaced apart from each other and connected to the first active layer;

the second thin film transistor includes:

a second active layer on the base substrate;

a second gate electrode spaced apart from the second active layer; and a second source electrode and a second drain electrode, which are spaced apart from each other and connected to the second active layer; and wherein the first thin film transistor and the second thin film transistor are vertically stacked, and all of the first active layer, the first gate electrode, the second active layer, and the second gate electrode overlap with each other, the first active layer and the second active layer are each vertically between the first gate electrode and the second gate electrode, and the first active layer and the second active layer each overlapping with both the first gate electrode and the second gate electrode, and wherein one of the first source electrode and the first drain electrode is connected to one of the second source electrode and the second drain electrode, the one of the first source electrode and the first drain electrode is integrally formed with the one of the second source electrode and the second drain electrode, and the one of the second source electrode and the second drain electrode contacts a side surface of the second active layer.

12. The display device of claim 11, further comprising a gate driver on the base substrate, wherein the gate driver includes the first thin film transistor and the second thin film transistor.

13. The display device of claim 12, wherein the gate driver includes two or more pull-up transistors, and each of the first thin film transistor and the second thin film transistor is a respective pull-up transistor of the two or more pull-up transistors.

14. The display device of claim 12, wherein the gate driver includes two or more pull-down transistors, and each of the first thin film transistor and the second thin film transistor is a respective pull-down transistor of the two or more pull-down transistors.

15. The display device of claim 12, wherein the gate driver includes two or more reset transistors, and each of the first thin film transistor and the second thin film transistor is a respective reset transistor of the two or more reset transistors.

16. The display device of claim 12, wherein the gate driver includes two or more switching transistors, and each of the first thin film transistor and the second thin film transistor is a respective switching transistor of the two or more switching transistors.

17. The display device of claim 11, further comprising a pixel driving circuit on the base substrate, wherein the pixel driving circuit includes the first thin film transistor and the second thin film transistor.

18. The display device of claim 17, wherein the pixel driving circuit includes an internal compensation circuit.

19. A display device comprising:

a data driver; and a display panel including:

a base substrate;

a gate driver on the base substrate; and a pixel on the base substrate, the pixel being electrically connected to the data driver and the gate driver, wherein the gate driver includes a first thin film transistor on the base substrate, and a second thin film transistor on and overlapping the first thin film transistor;

wherein the first thin film transistor includes:

a first active layer;

a first gate electrode vertically separated from the first active layer; and a first source/drain electrode in contact with the first active layer;

wherein the second thin film transistor includes:

a second active layer overlapping the first active layer;

a second gate electrode vertically separated from the second active layer; and a second source/drain electrode in contact with the second active layer and in contact with the first source/drain electrode; and wherein the first thin film transistor and the second thin film transistor are vertically stacked, and all of the first active layer, the first gate electrode, the second active layer, and the second gate electrode overlap with each other, wherein the first source/drain electrode is connected to the second source/drain electrode at one contact hole, the first source/drain electrode is integrally formed with the second source/drain electrode, and the second source/drain electrode contacts a lateral surface of the second active layer, wherein the first gate electrode and the second gate electrode are integrally formed to be a common gate electrode, wherein the common gate electrode is disposed between the first active layer and the second active layer, and the first thin film transistor and the second thin film transistor are configured to be simultaneously turned on by a gate voltage applied to the common gate electrode.

* * * * *